(12) United States Patent
Malatkar et al.

(10) Patent No.: US 10,985,080 B2
(45) Date of Patent: Apr. 20, 2021

(54) ELECTRONIC PACKAGE THAT INCLUDES LAMINATION LAYER

(71) Applicant: Intel Corporation, Santa Clara, CA (US)

(72) Inventors: Pramod Malatkar, Chandler, AZ (US); Kyle Yazzie, Chandler, AZ (US); Naga Sivakumar Yagnamurthy, Chandler, AZ (US); Richard J. Harries, Chandler, AZ (US); Dilan Seneviratne, Chandler, AZ (US); Praneeth Akkinepally, Chandler, AZ (US); Xuefei Wan, Chandler, AZ (US); Yonggang Li, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 15/778,042

(22) PCT Filed: Nov. 24, 2015

(86) PCT No.: PCT/US2015/062397
§ 371 (c)(1),
(2) Date: May 22, 2018

(87) PCT Pub. No.: WO2017/091211
PCT Pub. Date: Jun. 1, 2017

(65) Prior Publication Data
US 2018/0350709 A1 Dec. 6, 2018

(51) Int. Cl.
*H01L 23/31* (2006.01)
*H01L 23/34* (2006.01)
(Continued)

(52) U.S. Cl.
CPC ........ *H01L 23/3128* (2013.01); *H01L 23/315* (2013.01); *H01L 23/3135* (2013.01);
(Continued)

(58) Field of Classification Search
CPC .......................... H01L 23/3135; H01L 25/105
See application file for complete search history.

(56) References Cited

U.S. PATENT DOCUMENTS 7,851,894 B1* 12/2010 Scanlan ................ H01L 25/105
257/659
2002/0084523 A1 7/2002 Sorimachi et al.
(Continued)

FOREIGN PATENT DOCUMENTS

TW 201735296 A 10/2017
WO WO-2017091211 A1 6/2017

OTHER PUBLICATIONS

"International Application Serial No. PCT/US2015/062397, International Search Report dated Aug. 17, 2016", 3 pgs.
(Continued)

*Primary Examiner* — Kenneth Parker
*Assistant Examiner* — Long H Le
(74) *Attorney, Agent, or Firm* — Schwegman Lundberg & Woessner, P.A.

(57) ABSTRACT

An electronic package that includes a substrate and an electronic component attached to the substrate. A laminated layer is attached to an upper surface of the substrate such that the laminated layer covers the electronic component. The electronic package may further include a stiffener mounted on the laminated layer where the stiffener is over the electronic component.

18 Claims, 3 Drawing Sheets

(51) Int. Cl.
*H01L 23/48* (2006.01)
*H01L 25/10* (2006.01)
*H01L 23/00* (2006.01)
*H01L 23/498* (2006.01)
*H01L 23/538* (2006.01)

(52) U.S. Cl.
CPC .......... *H01L 23/3142* (2013.01); *H01L 23/34* (2013.01); *H01L 23/48* (2013.01); *H01L 23/562* (2013.01); *H01L 25/105* (2013.01); *H01L 23/49816* (2013.01); *H01L 23/5389* (2013.01); *H01L 24/16* (2013.01); *H01L 24/32* (2013.01); *H01L 24/73* (2013.01); *H01L 24/81* (2013.01); *H01L 24/97* (2013.01); *H01L 2224/16225* (2013.01); *H01L 2224/32225* (2013.01); *H01L 2224/73204* (2013.01); *H01L 2224/81203* (2013.01); *H01L 2225/1023* (2013.01); *H01L 2225/1058* (2013.01); *H01L 2924/00014* (2013.01); *H01L 2924/10253* (2013.01); *H01L 2924/1433* (2013.01); *H01L 2924/15311* (2013.01); *H01L 2924/15331* (2013.01); *H01L 2924/181* (2013.01); *H01L 2924/351* (2013.01); *H01L 2924/3511* (2013.01)

(56) References Cited

U.S. PATENT DOCUMENTS

| | | | |
|---|---|---|---|
| 2003/0053297 | A1 | 3/2003 | Gaynes et al. |
| 2007/0001318 | A1* | 1/2007 | Starkston .............. H01L 21/563 257/782 |
| 2008/0073769 | A1* | 3/2008 | Wu ........................ H01L 25/105 257/686 |
| 2008/0230887 | A1* | 9/2008 | Sun ........................ H01L 21/565 257/686 |
| 2010/0109169 | A1 | 5/2010 | Kolan et al. |
| 2012/0049341 | A1 | 3/2012 | Bezama et al. |
| 2014/0191386 | A1 | 7/2014 | Lee et al. |
| 2014/0264810 | A1* | 9/2014 | Hsu ..................... H01L 23/3128 257/686 |
| 2014/0374902 | A1 | 12/2014 | Lee et al. |
| 2015/0041979 | A1* | 2/2015 | Goudarzi .......... H01L 23/49811 257/738 |
| 2015/0145115 | A1 | 5/2015 | Liu et al. |
| 2017/0047264 | A1* | 2/2017 | Im ......................... H01L 21/563 |

OTHER PUBLICATIONS

"International Application Serial No. PCT/US2015/062397, Written Opinion dated Aug. 17, 2016", 8 pgs.
"Taiwanese Application Serial No. 105134021, First Office Action dated Jan. 13, 2020", w English translation of search report, 11 pgs.
"Taiwanese Application Serial No. 105134021, Response filed Apr. 8, 2020 to First Office Action dated Jan. 13, 2020", w English Claims, 45 pgs.

* cited by examiner

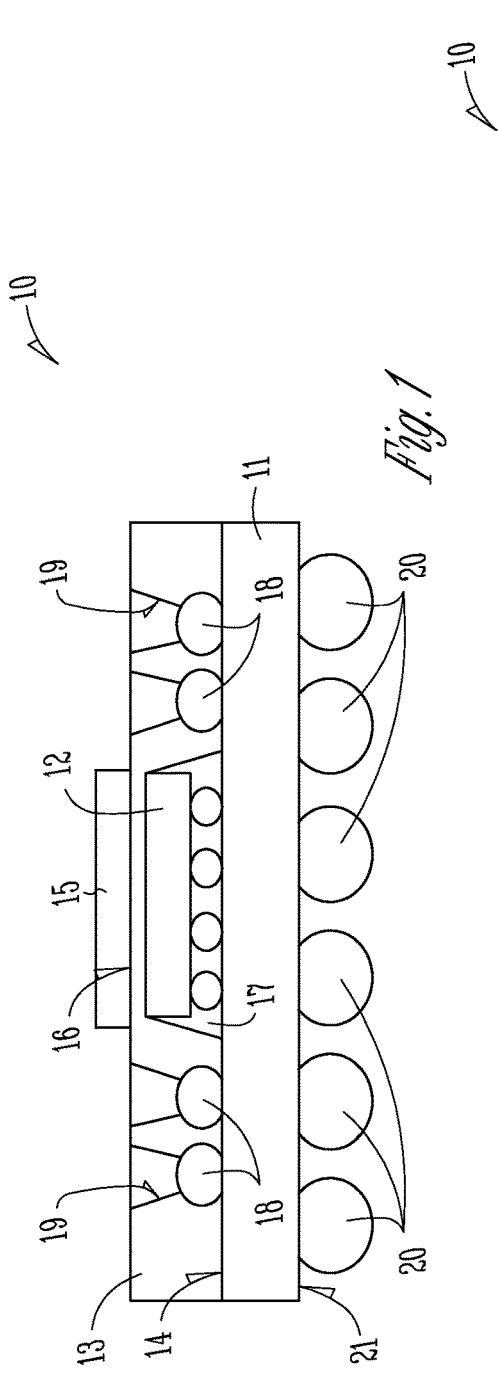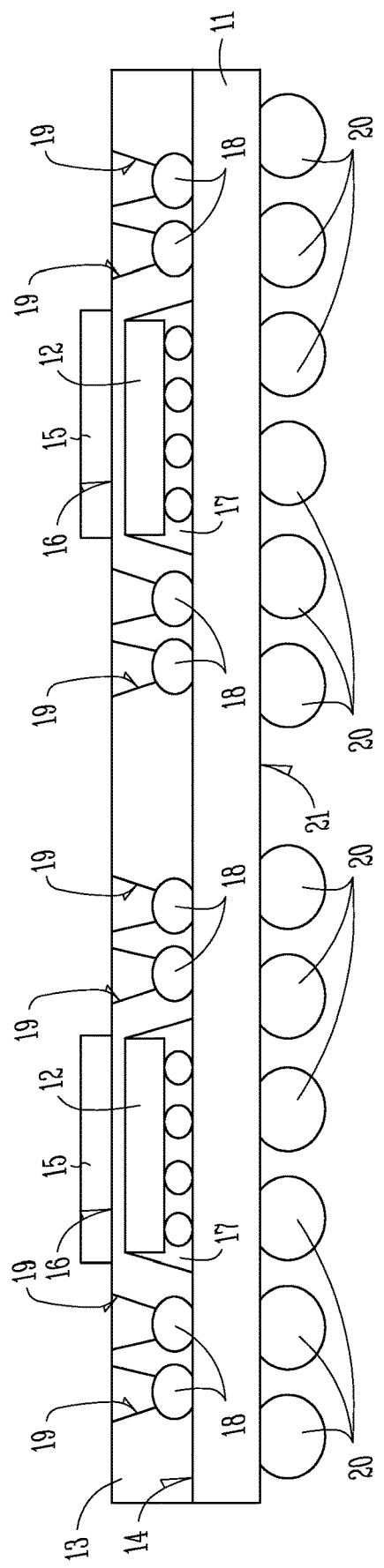

ELECTRONIC PACKAGE THAT INCLUDES LAMINATION LAYER

CROSS-REFERENCE TO RELATED APPLICATION

This application is a U.S. National Stage Filing under 35 U.S.C. 371 from International Application No. PCT/US2015/062397, filed on Nov. 24, 2015, and published as WO 2017/091211, which application is incorporated herein by reference in its entirety.

BACKGROUND

Some electronic products (e.g., mobile phones, smart phones, tablet computers, etc.) are typically very restricted in available space because there are often severe limitations for chip and package area and height (among other physical and electrical parameters). Therefore, it is extremely important to reduce the size of electronic components (e.g., dies) on a substrate.

However, when electronic components/packages are made relatively thin in order to accommodate this need for reduced sized electronic components, there can be difficulties that are associated with fabricating such components. As an example, thin components/packages have historically been a huge challenge for the semiconductor industry.

Some electronic components/packages include a silicon die that has a relatively low coefficient of thermal expansion (CTE) attached to a substrate that has a high CTE. Therefore, manufacturing difficulties often arise because the die is attached to the substrate which warps with temperature changes during fabrication of the components/packages. The differences in the CTE between the die and the substrate can make it extremely difficult to balance the design and material properties in a component/package in order to obtain a flat package at (i) room temperature; and (ii) solder ball melting temperature.

One approach to addressing manufacturing difficulties that are caused by the differences in the CTE between the die and the substrate is to include a mold material in the component/package in order to provide rigidity. Adding a mold material to the component/package suffers from several drawbacks.

Adding a mold usually increases the overall size of the component/package (especially the Z height of the component/package). In addition, some high performance components/packages commonly need to remove sections of the mold in order to expose parts of the component/package from the mold. Removing parts of the mold may reduce the effectiveness of the mold relative to warpage reduction.

During a molding process, the molding material may cure as it flows into and through various cavities and channels. Therefore, the properties of the mold may be different as a function of location and may also include location-dependent residual stresses. In addition, molding is usually a complicated process where the package shape and residual stresses within the mold are highly dependent on process conditions (e.g., mold curing temperature, post mold curing temperature, etc.).

BRIEF DESCRIPTION OF THE DRAWINGS

FIG. 1 shows a side view of an example electronic package.

FIG. 2 shows a side view of another example electronic package.

DESCRIPTION OF EMBODIMENTS

Figure 3:
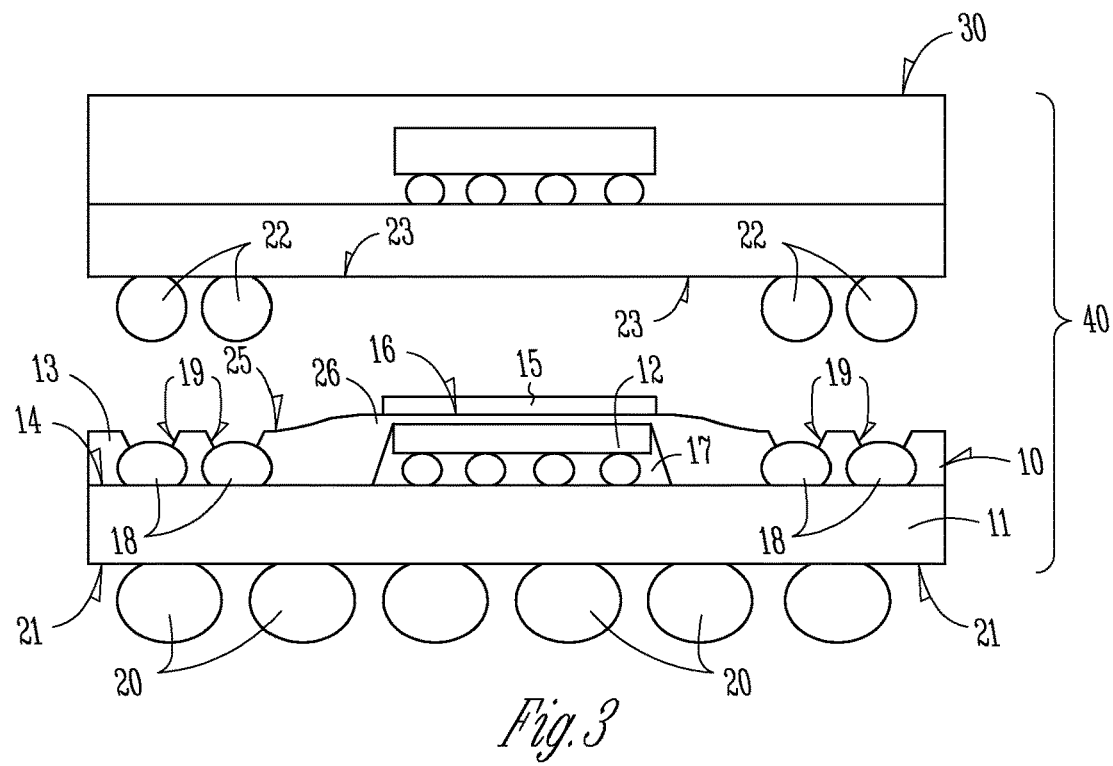
FIG. 3 shows a side view of an example electronic system before a first electronic package is assembled to a second electronic package.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

FIG. 1 illustrates an example electronic package 10. The electronic package 10 includes a substrate 11 and an electronic component 12 attached to the substrate 11. The electronic package 10 further includes a laminated layer 13 on an upper surface 14 of the substrate 11 such that the laminated layer 13 covers the electronic component 12.

In some forms, the electronic package 10 further includes a stiffener 15 that is mounted on the laminated layer 13. The stiffener 15 is over the electronic component 12. It should be noted that the stiffener 15 may be partially over, or fully over, the electronic component 12.

The degree to which the stiffener 15 is over the electronic component 12 will depend in part on the (i) thickness of the laminated layer 13; (ii) the size of the electronic component 12; (iii) the overall size and thickness of the stiffener 15; and/or (iv) the type of material that is used for the stiffener 15 (among other factors). The stiffener 15 may have a thickness between 25 and 100 micrometers.

As an example, the stiffener 15 may be copper (among many other types of materials) that includes a roughened bottom surface 16 that engages the laminated layer 13. The roughened bottom surface 16 of the stiffener 15 may allow the stiffener 15 to be attached to the laminated layer 13 with, or without, an adhesive depending on the material that is used for the laminated layer 13 (among other factors).

In addition, the roughened bottom surface 16 of the stiffener 15 may allow the stiffener 15 to be mounted to the laminated layer with less pressure than would otherwise be required with a smooth bottom surface on the stiffener 15. As an example, the thickness of the laminated layer 13 above the electronic component 12 where the stiffener 15 is mounted may be around 10-20 micrometers. In some forms, the electronic package 10 may be baked at temperatures between 150 and 200° C. to cure the laminated material and also to bond the stiffener 15 and the electronic component 12 firmly to the laminated layer 13.

The electronic component 12 may be an active component (e.g., a die). It should be noted that any type of electronic component 12 may be included in the electronic package 10. The type of electronic component 12 that is included in the electronic package 10 will depend in part on the application where the electronic package 10 is to be used (among other factors).

The electronic component 12 may be thermal compression bonded to the substrate 11. In addition, the electronic package 10 may further include an underfill 17 that is between the electronic component 12 and the substrate 11. It should be noted that the electronic component 12 may be attached to the substrate 11 in any manner that is known now, or discovered in the future.

In other forms, the laminated layer 13 may serve as an underfill between the electronic component 12 and the substrate 11. It should be noted that using the laminated layer 13 as an underfill is not shown in the FIGS.

In the illustrated example FIGS., the electronic package 10 further includes solder balls 18, attached to the upper surface 14 of the substrate 11. The laminated layer 13 covers the solder balls 18.

The electronic package 10 may further include voids 19 that extend through the laminated layer 13 to the solder balls 18 on the substrate 11. The voids 19 may be drilled into the laminated layer 13 using a variety of techniques (e.g., laser drilling) in order to expose the top sides of the solder balls 18.

In some forms, the electronic package 10 may not include solder balls 18 such that the voids 19 extend all of the way through the laminated layer 13 to the upper surface 14 of the substrate 11 (not shown in FIGS.). If the voids 19 extend all the way through the laminated layer 13 to the upper surface 14 of the substrate 11, then the electronic package may further include vias that are created within the voids 19 in any manner that is known now (e.g., electrolytic plating), or discovered in the future.

In some forms, the electronic package 10 may further include solder balls 20 that are attached to a bottom surface 21 of the substrate 11. The number, type, and size of the solder balls 20 will depend in part on the application where the electronic package 10 is to be used (among other factors).

Figure 4:
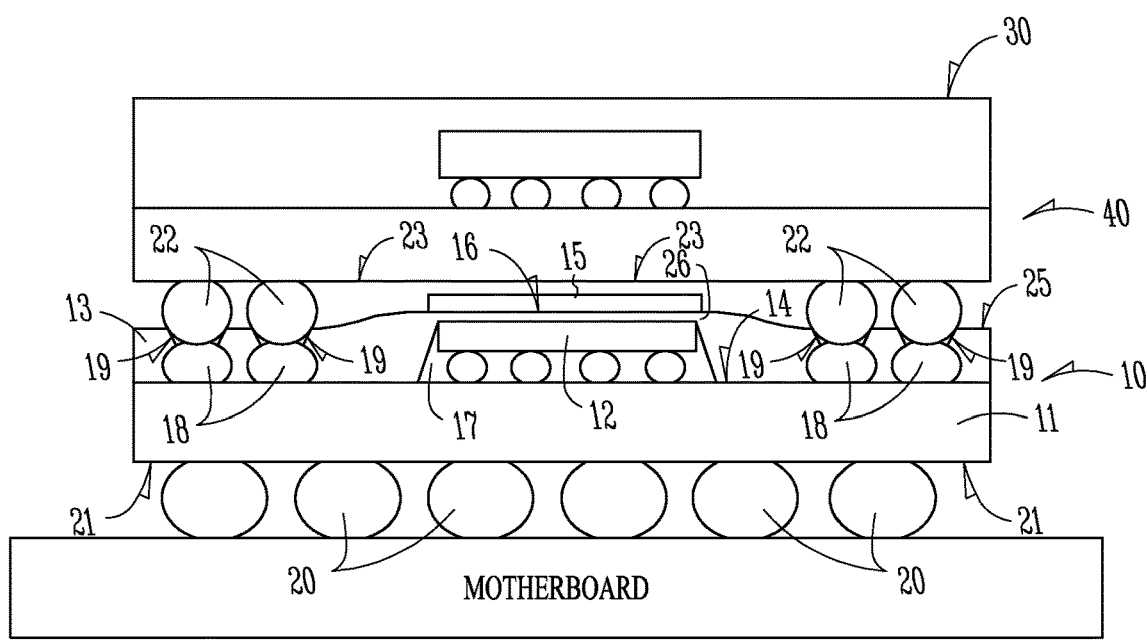
FIG. 4 shows a side view of the example electronic system of FIG. 3 after the first electronic package is assembled to the second electronic package.

As shown in FIGS. 3 and 4 the laminated layer 13 may have a non-planar upper surface 25. As an example, a portion 26 of the laminated layer 13 that covers the electronic component 12 may be farther from the upper surface 14 of the substrate 11 than the rest of the laminated layer 13. This particular configuration for the laminated layer 13 may permit the electronic package 10 to be attached to another electronic package 30 (shown in FIGS. 3 and 4) such that the electronic system 40 which is fabricated has a relatively lower z-height (shown most clearly in FIG. 4).

FIG. 3 shows a side view of an example electronic system of the example electronic system 40 before a first electronic package 10 is assembled to a second electronic package 30. FIG. 4 shows a side view of the example electronic system 40 of FIG. 3 after the first electronic package 10 is assembled to the second electronic package 30.

The electronic system 40 includes a first electronic package 10 that includes a substrate 11, an electronic component 12 attached to the substrate 11 and a laminated layer 13 on an upper surface 14 of this substrate 11 such that the laminated layer 13 covers the electronic component 12. The electronic system 40 further includes a second electronic package 30 that is attached to the first electronic package 10.

In some forms, the second electronic package 30 is attached to an upper surface 14 of the substrate 11. As shown in FIGS. 3 and 4, the second electronic package 30 may be attached indirectly (or directly in alternative forms) to an upper surface of the substrate. The manner in which the first electronic package 10 is secured to the second electronic package 30 will depend in part on the types of first and second electronic packages 10, 30 that are used in the electronic system 40 as well as manufacturing considerations that are associated with fabricating the first and second electronic packages 10, 30 and the overall electronic system 40.

In the example form that is illustrated in FIGS. 3 and 4, the electronic system 40 further includes a stiffener 15 that is mounted on a laminated layer 13. As discussed above, the stiffener 15 may be over some, or all, of the electronic component 12.

The first electronic package 10 includes solder balls 18 that are attached to an upper surface 14 of the substrate 11. The laminated layer 13 covers the solder balls 18 and includes voids 19 that extend through the laminated layer 13 to the solder balls 18. The second electronic package 30 may be attached to the solder balls 18 of the first electronic package 10 within the voids 19. As an example, the second electronic package 30 may be attached to the solder balls 18 of the first electronic package 10 using solder balls 22 that are on a lower surface 23 of the second electronic package 30.

As discussed above, the laminated layer 13 may have a non-planar upper surface 25. A portion 26 of the laminated layer 13 that covers the electronic component 12 may be farther from the upper surface 14 of the substrate 11 than the rest of the laminated layer 13.

The non-planar topology of the laminated layer 13 may be used to reduce the size of the solder balls 18, 22 that are used to connect the first and second electronic packages 10, 30. Reducing the size of the solder balls 18, 22 may lower the risk associated with solder ball bridging.

The electronic packages 10, 30 and electronic system 40 described herein may utilize a variety of different types of materials for the laminated layer 13. As examples, the laminated layer 13 may be ABF-GX-T31, ABF-GX92 or a solder resist film (or some other material).

In addition, the laminated layer 13 may be laminated on to the upper surface 14 of the substrate 11 at a variety of different times during manufacturing of the electronic packages 10, 30. As examples, the laminated layer 13 may be attached to the upper surface 14 of the substrate 11 when the electronic package 10 is singulated, in strip form, or panel form.

The types of material that are used for the stiffener 15 will vary depending on a variety of manufacturing and application factors. As examples, the stiffener 15 may be copper, stainless steel or a combination of different materials.

The electronic packages 10, 30 and electronic systems 40 described herein may allow for a much simpler manufacturing process to be utilized in order to fabricate the electronic packages 10, 30. In addition, as discussed above, the lamination layer 13 may be attached to the upper surface 14 of the substrate 11 at a variety of times during the manufacturing process.

In some forms, the lamination layer 13 may be a lower cost alternative to using conventional mold materials. In addition, utilizing a lamination process may enable tighter through mold interconnect (TMI) pitch that permits the smaller form factor designs as well as possibly supporting higher bandwidth memory requirements.

The electronic packages 10, 30 and electronic systems described herein may also be an improvement over conventional molding architectures because it is an extremely challenging to reduce high temperature warpage without impacting room temperature warpage. The electronic packages 10, 30 and electronic systems 40 described herein may provide warpage control at room temperatures and high temperatures due to the presence of the stiffener 15.

Figure 5:
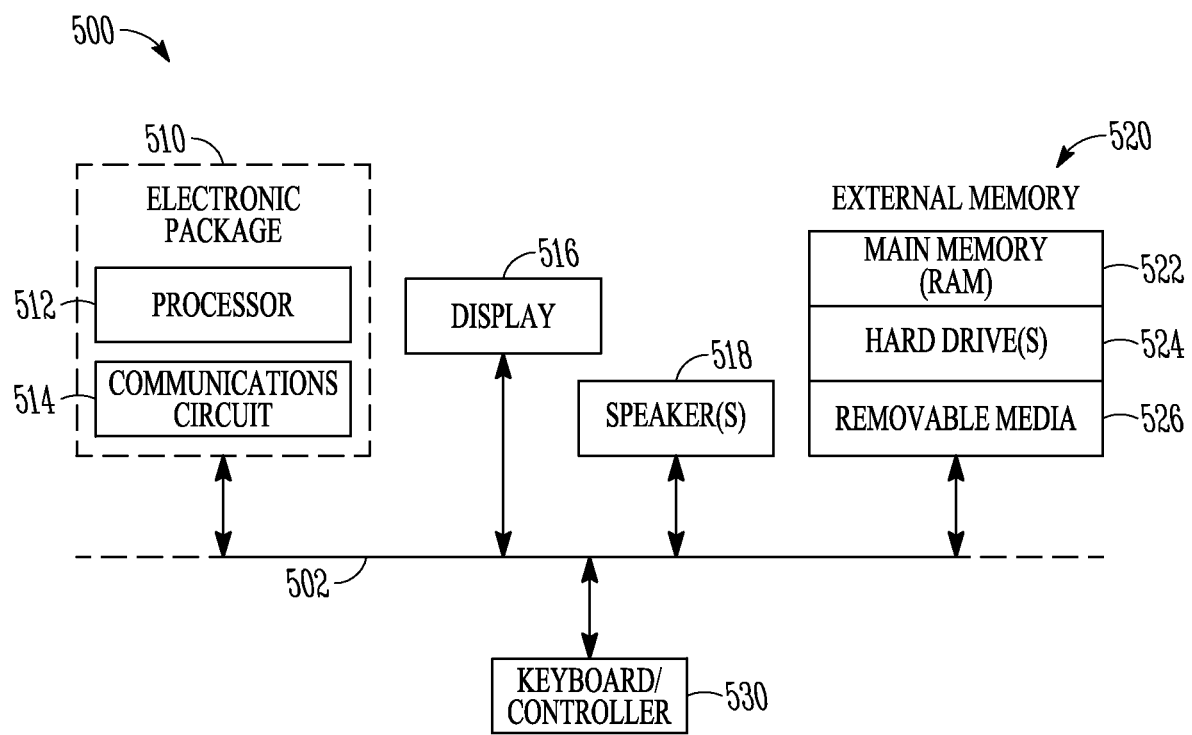
FIG. 5 is a block diagram of an electronic apparatus that includes the electronic packages described herein.

FIG. 5 is a block diagram of an electronic apparatus 500 incorporating at least one electronic package 10, 30 and/or electronic system 40 described herein. Electronic apparatus 500 is merely one example of an electronic apparatus in which forms of at least one electronic package 10, 30 and/or electronic system 40 described herein may be used.

Examples of an electronic apparatus 500 include, but are not limited to, personal computers, tablet computers, mobile telephones, game devices, MP3 or other digital music players, etc. In this example, electronic apparatus 500 comprises a data processing system that includes a system bus 502 to couple the various components of the electronic apparatus 500. System bus 502 provides communications links among the various components of the electronic apparatus 500 and may be implemented as a single bus, as a combination of busses, or in any other suitable manner.

An electronic assembly 510 that includes any of the at least one electronic package 10, 30 and/or electronic system 40 as describe herein may be coupled to system bus 502. The electronic assembly 510 may include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 510 are a custom circuit, an application-specific integrated circuit (ASIC), or the like, such as, for example, one or more circuits (such as a communications circuit 514) for use in wireless devices like mobile telephones, tablet computers, laptop computers, two-way radios, and similar electronic systems. The IC can perform any other type of function.

The electronic apparatus 500 may also include an external memory 520, which in turn may include one or more memory elements suitable to the particular application, such as a main memory 522 in the form of random access memory (RAM), one or more hard drives 524, and/or one or more drives that handle removable media 526 such as compact disks (CD), flash memory cards, digital video disk (DVD), and the like.

The electronic apparatus 500 may also include a display device 516, one or more speakers 518, and a keyboard and/or controller 530, which can include a mouse, trackball, touch screen, voice-recognition device, or any other device that permits a system user to input information into and receive information from the electronic apparatus 500.

To better illustrate the electronic packages and/or electronic systems disclosed herein, a non-limiting list of embodiments is provided herein:

Example 1 includes an electronic package. The electronic package includes a substrate; an electronic component attached to the substrate; a laminated layer on an upper surface of the substrate such that the laminated layer covers the electronic component.

Example 2 includes the electronic package of example 1, and further including a stiffener mounted on the laminated layer, wherein the stiffener is over the electronic component.

Example 3 includes the electronic package of example 2, wherein the stiffener is partially over the electronic component.

Example 4 includes the electronic package of any one of examples 2 to 3, wherein the stiffener is copper.

Example 5 includes the electronic package of any one of examples 2 to 4, wherein the stiffener includes a roughened bottom surface that engages the laminated layer.

Example 6 includes the electronic package of any one of examples 1 to 5, wherein the electronic component is a die.

Example 7 includes the electronic package of any one of examples 1 to 6, wherein the electronic component is thermal compression bonded to the substrate.

Example 8 includes the electronic package of any one of examples 1 to 7, and further including an underfill between the electronic component and the substrate.

Example 9 includes the electronic package of any one of examples 1 to 7, wherein the laminated layer serves as an underfill between the electronic component and the substrate Example 10 includes the electronic package of any one of examples 1 to 9, and further including voids extending through the laminated layer to the upper surface of the substrate.

Example 11 includes the electronic package of any one of examples 1 to 10, and further including solder balls attached to an upper surface of the substrate, wherein the laminated layer covers the solder balls.

Example 12 includes the electronic package of example 11, and further including voids extending through the laminated layer to the solder balls on the substrate.

Example 13 includes the electronic package of any one of examples 1 to 12, and further including solder balls attached to a bottom surface of the substrate.

Example 14 includes the electronic package of any one of examples 1 to 13, wherein the laminated layer has a non-planar upper surface.

Example 15 includes the electronic package of example 14, wherein a portion of the laminated layer that covers the electronic component is farther from the upper surface of the substrate than the rest of the laminated layer.

Example 16 includes an electronic system. The electronic system includes a first electronic package that includes a substrate, an electronic component attached to the substrate and a laminated layer on an upper surface of the substrate such that the laminated layer covers the electronic component; and a second electronic package attached to the first electronic package.

Example 17 includes the electronic system of example 16, wherein the second electronic package is attached to an upper surface of the substrate.

Example 18 includes the electronic system of any one of examples 16 to 17, and further including a stiffener mounted on the laminated layer, wherein the stiffener is over the electronic component Example 19 includes the electronic system of any one of examples 16 to 18, wherein the first electronic package includes solder balls attached to an upper surface of the substrate, and wherein the laminated layer covers the solder balls and includes voids that extend through the laminated layer to the solder balls, and wherein the second electronic package is attached to the solder balls of the first electronic package within the voids.

Example 20 includes the electronic system of any one of examples 16 to 19, wherein the laminated layer has a non-planar upper surface, wherein a portion of the laminated layer that covers the electronic component is farther from the upper surface of the substrate than the rest of the laminated layer.

Example 21 includes an electronic package. The electronic package includes a substrate; an electronic component attached to the substrate; a laminated layer on an upper surface of the substrate such that the laminated layer covers the electronic component; and a stiffener mounted on the laminated layer, wherein the stiffener is over the electronic component.

Example 22 includes the electronic package of example 21, wherein the stiffener is copper and is partially over the electronic component.

Example 23 includes the electronic package of any one of examples 21 to 22, wherein the stiffener includes a roughened bottom surface that engages the laminated layer.

Example 24 includes the electronic package of any one of examples 21 to 23, wherein the laminated layer has a non-planar upper surface, and wherein a portion of the laminated layer that covers the electronic component is farther from the upper surface of the substrate than the rest of the laminated layer.

This overview is intended to provide non-limiting examples of the present subject matter. It is not intended to provide an exclusive or exhaustive explanation. The detailed description is included to provide further information about the electronic packages and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package comprising:
    a substrate;
    an electronic component attached to the substrate;
    a laminated layer in direct contact with an upper surface of the substrate such that the laminated layer covers the electronic component, wherein the laminated layer has a non-planar upper surface, wherein a portion of the laminated layer that covers the electronic component is farther from the upper surface of the substrate than the rest of the laminated layer: and
    a plurality of solder balls attached to the upper surface of the substrate, each of the solder balls including a portion directly contacting the upper surface of the substrate;
    the laminated layer further includes voids extending through the laminated layer away from the upper surface of the laminated layer to the solder balls such that a width of the voids at a point where the voids meets the solder balls is less than a maximum width of the solder balls.

2. The electronic package of claim 1, further comprising a stiffener mounted on the laminated layer, wherein the stiffener is over the electronic component.

3. The electronic package of claim 2, wherein the stiffener is partially over the electronic component.

4. The electronic package of claim 2, wherein the stiffener is copper.

5. The electronic package of claim 2, wherein the stiffener includes a roughened bottom surface that engages the laminated layer.

6. The electronic package of claim 1, wherein the electronic component is a die.

7. The electronic package of claim 1, wherein the electronic component is thermal compression bonded to the substrate.

8. The electronic package of claim 7, further comprising an underfill between the electronic component and the substrate.

9. The electronic package of claim 7, wherein the laminated layer serves as an underfill between the electronic component and the substrate.

10. The electronic package of claim 1, further comprising solder balls attached to an upper surface of the substrate, wherein the laminated layer covers the solder balls.

11. The electronic package of claim 1, further comprising solder balls attached to a bottom surface of the substrate.

12. An electronic system comprising:
a first electronic package that includes a substrate, an electronic component attached to the substrate and a laminated layer in direct contact with an upper surface of the substrate such that the laminated layer covers the electronic component, wherein the laminated layer has a non-planar upper surface, wherein a portion of the laminated layer that covers the electronic component is farther from the upper surface of the substrate than the rest of the laminated layer, the first electronic package further including a plurality of solder balls attached to the upper surface of the substrate, each of the solder balls including a portion directly contacting the upper surface of the substrate, the laminated layer further includes voids extending through the laminated layer away from the upper surface of the laminated layer to the solder balls such that a width of the voids at a point where the voids meets the solder balls is less than a maximum width of the solder balls; and
a second electronic package attached to the first electronic package.

13. The electronic system of claim 12, wherein the second electronic package is attached to an upper surface of the substrate.

14. The electronic system of claim 12, further comprising a stiffener mounted on the laminated layer, wherein the stiffener is over the electronic component.

15. The electronic system of claim 12, wherein the second electronic package is attached to the solder balls of the first electronic package within the voids.

16. An electronic package comprising:
a substrate;
an electronic component attached to the substrate;
a laminated layer in direct contact with an upper surface of the substrate such that the laminated layer covers the electronic component, wherein the laminated layer has a continuous non-planar upper surface, wherein a portion of the laminated layer that covers the electronic component is farther from the upper surface of the substrate than the rest of the laminated layer;
a plurality of solder balls attached to the upper surface of the substrate, each of the solder balls including a portion directly contacting the upper surface of the substrate, the laminated layer further includes voids extending through the laminated layer away from the continuous upper surface of the laminated layer to the solder balls such that a width of the voids at a point where the voids meets the solder balls is less than a maximum width of the solder balls; and
a stiffener mounted on the laminated layer, wherein the stiffener is over the electronic component.

17. The electronic package of claim 16, wherein the stiffener is copper and is partially over the electronic component.

18. The electronic package of claim 16, wherein the stiffener includes a roughened bottom surface that engages the laminated layer.

* * * * *